United States Patent [19]

Burnham et al.

[11] Patent Number: 4,589,115

[45] Date of Patent: May 13, 1986

[54] WAVELENGTH TUNING OF QUANTUM WELL HETEROSTRUCTURE LASERS USING AN EXTERNAL GRATING

[75] Inventors: Robert Burnham, Palo Alto, Calif.; Nick Holonyak, Jr., Urbana, Ill.; Harlan F. Chung, Daly City, Calif.

[73] Assignee: Xerox Corporation, Stamford, Conn.

[21] Appl. No.: 530,555

[22] Filed: Sep. 9, 1983

[51] Int. Cl.$^4$ .............................................. H01S 3/101
[52] U.S. Cl. ...................................... 372/20; 372/45; 372/92; 372/102; 372/108
[58] Field of Search ...................... 372/44, 45, 20, 49, 372/102, 108, 92

[56] References Cited

U.S. PATENT DOCUMENTS 3,753,148  8/1973  Billman ................................ 372/102
3,928,818 12/1975  White .................................. 372/108
4,092,659  5/1978  Ettenberg ............................. 372/49

OTHER PUBLICATIONS

J. A. Rossi et al., "Time Delays in External . . . Diode Lasers", Applied Physics Letters, vol. 23(5) pp. 254–256 (9/1/73).
J. A. Rossi et al., "High–Power Narrow . . . GaAs Diode Lasers", Applied Physics Letters, vol. 23(1), pp. 25–27 (7/1/73).
Thomas L. Paoli et al., "Single Longitudinal . . . Optical Feedback", Applied Physics Letters, vol. 25(12), pp. 744–746 (12/15/74).
P. D. Wright et al., "Homogeneous . . . External Grating Cavity", Applied Physics Letters, vol. 29(1), pp. 18–20 (7/1/76).
P. D. Wright et al., "$In_{1-x}Ga_xP_{1-z}As_z$ . . . External Cavity", Journal of Applied Physics, vol. 47(8), pp. 3580–3586 (8/76).
R. Wyatt et al., "External Cavity Laser with 55 nm Tuning Range", Electronics Letters, vol. 19(3), pp. 110–112 (2/3/83).
R. D. Dupuis et al., "Quantum Well . . . Chemical Vapor Deposition", IEEE Journal of Quantum Electronics, vol. QE-15(8) pp. 756–761 (8/79).
J. J. Coleman et al., "Induced Phonon . . . Heterostructures ($L_2 \approx 200$–500 Å)", Applied Physics Letters, vol. 37(1), pp. 15–17 (7/1/80).

Primary Examiner—James W. Davie
Attorney, Agent, or Firm—W. Douglas Carothers, Jr.

[57] ABSTRACT

The method of and apparatus for tuning the wavelength using an external diffraction grating is accomplished with a quantum well injection laser wherein the range of operating wavelength selection is extended beyond the expectations of wavelength selection in fundamental emission spectrum of conventional bulk-crystal heterostructure lasers to include wavelength selection at the multiple carrier recombination transition energies possible in the conduction band sub-bands and valence band sub-bands present in quantum well heterostructures of single or multiple quantum well lasers. Quantum well heterostructure lasers have a unique advantage over previous tuned semiconductor lasers, as exemplified in the previously cited prior art, in that the active region of the quantum well laser can be bandfilled to well above the bulk crystal band edge at moderate current densities indicative of excellent candidates for broad band tuning through a wide range of the quantum well sub-bands of the quantum well structure.

17 Claims, 10 Drawing Figures

WAVELENGTH TUNING OF QUANTUM WELL HETEROSTRUCTURE LASERS USING AN EXTERNAL GRATING

BACKGROUND OF THE INVENTION

This invention relates to semiconductor lasers and more particularly to single and multiple quantum well lasers that may have their operating or primary emission wavelength tuned to a selectively different emission wavelength for particular applications, e.g., optical storage systems or optical communication systems, or for periodic adjustment of the emission wavelength to a predetermined and desired value as in spectroscopic applications or in variable frequency communication systems.

Semiconductor lasers are used in a wide variety of applications requiring desired and fairly precise intensity, optical output power and wavelength of operation. In fabricating a semiconductor laser by available epitaxial processes, it is not possible to know precisely what the predominant emission wavelength will be in the wavelength gain spectrum of the laser.

One manner previously used in selecting an operating wavelength for a semiconductor laser is the provision of an external diffraction grating aligned in the path for optical emission from one facet of the laser. The grating provides, with appropriate lenses, the required feedback to support lasing conditions and creates a coupled cavity which becomes an operating segment of the Fabry-Perot cavity formed by the cleaved surfaces of the laser. The grating also provides selective wavelength feedback so that a single oscillation frequency with narrow linewidth may be selected and is selectable over the spectral emission of the semiconductor laser. Examples of the art related to wavelength selective, external grating cavity techniques are found in the following articles and referenced articles cited therein: J. A. Rossi et al., "Time Delays in External-Cavity-Controlled GaAs/Ga$_x$Al$_{1-x}$As Single-Heterostructure Diode Lasers", *Applied Physics Letters*, Vol. 23(5), pp. 254–256 (Sept. 1, 1973); J. A. Rossi et al., "High-power Narrow-Linewidth Operation of GaAs Diode Lasers", *Applied Physics Letters*, Vol. 23(1), pp. 25–27 (July 1, 1973); Thomas L. Paoli et al., "Single Longitudinal Mode Operation of CW Junction Lasers by Frequency-Selective Optical Feedback", *Applied Physics Letters*, Vol. 25(12), pp. 744–746 (Dec. 15, 1974); P. D. Wright et al., "Homogeneous or Inhomogeneous Line Broadening in a Semiconductor Laser: Observations on In$_{1-x}$Ga$_x$P$_{1-z}$As$_z$ Double Heterojunctions in an External Grating Cavity", *Applied Physics Letters*, Vol. 29(1), pp. 18–20 (July 1, 1976); P. D. Wright et al., "In$_{1-x}$Ga$_x$P$_{1-z}$As$_z$ Double Heterojunction Laser Operation (77° K., Yellow) in an External Grating Cavity", *Journal of Applied Physics*, Vol. 47(8), pp. 3580–3586 (August 1976); and R. Wyatt et al., "External Cavity Laser with 55 nm Tuning Range", *Electronics Letters*, Vol. 19(3), pp. 110–112 (Feb. 3, 1983).

In most of these prior art exemplifications of external grating tuning, a semiconductor laser, with one of its output facet having an antireflection (AR) coating, has its output emission focused on an external grating provided single mode oscillation with narrow linewidths over wavelength ranges, in the best of cases, as much as 550 Å, which range is within the optical emission spectrum of the laser. See the last mentioned reference in the paragraph above.

Dye lasers are known to have a relatively wide tuning wavelength range compared to p-n junction diode semiconductor lasers which are considerably more limited primarily due to the fundamental fact that excess carriers thermalize rapidly to a small energy range near each band edge. The width of the recombination radiation spectrum in a conventional heterostructure laser of GaAs/GaAlAs is determined mainly by the active region energy gap but with some influence due to the concentration and type of impurity doping employed in the active region. A Si-doped GaAs active region, for example has provided for comparatively one of the widest energy range of tunability for semiconductor lasers. The tunable energy range, for example, is about 30 meV to 40 meV for these conventional lasers.

We have discovered that the range of wavelength selection can be materially increased as well as the selectivity of operating wavelength within the tunable energy range materially increased by employing a semiconductor injection laser, having as an essential feature, a quantum well active region. For example, we have successfully tuned across energy ranges of 130 meV and more.

SUMMARY OF THE INVENTION

According to this invention, the method of and apparatus for tuning the wavelength using an external diffraction grating is accomplished with a quantum well injection laser wherein the range of operating wavelength selection is extended beyond the expectations of wavelength selection in fundamental emission spectrum of conventional bulk-crystal heterostructure lasers to include wavelength selection at the multiple carrier recombination transition energies possible in the conduction band sub-bands and valence band sub-bands present in quantum well heterostructures of single or multiple quantum well lasers.

Quantum well heterostructure lasers have a unique advantage over previous tuned semiconductor lasers, as exemplified in the previously cited prior art, in that the active region of the quantum well laser can be band-filled to well above the bulk crystal band edge at moderate current densities indicative of excellent candidates for broad band turning through a wide range of the quantum well sub-bands of the quantum well structure.

Other objects and attainments together with a fuller understanding of the invention will become apparent and appreciated by referring to the following description and claims taken in conjunction with the accompanying drawings.

DETAILED DESCRIPTION OF PREFERRED EMBODIMENTS

Figure 1:
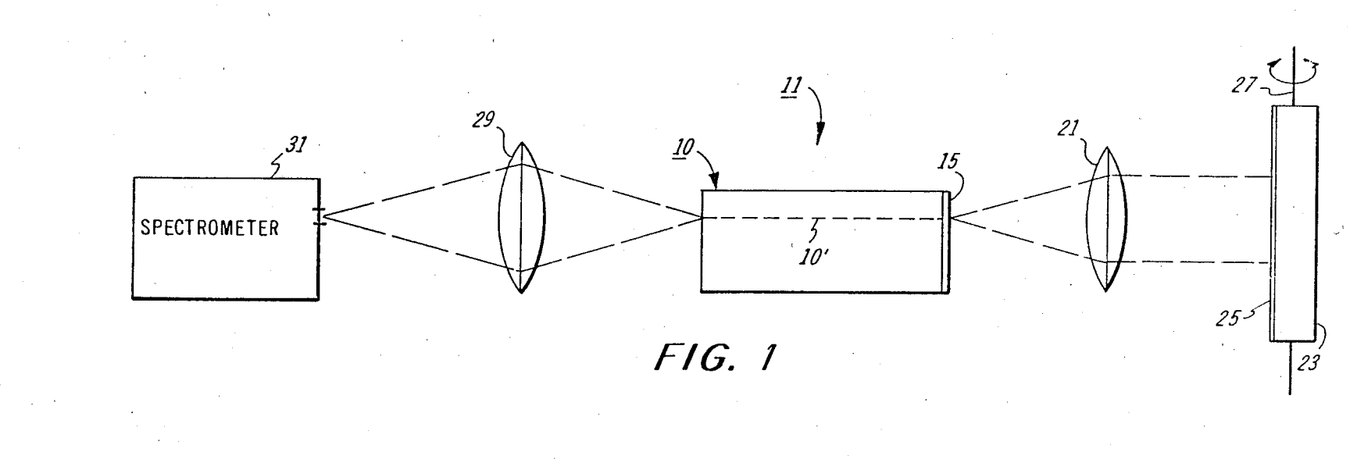
FIG. 1 is a schematic illustration of a tuning system to provide selective wavelength feedback via a quantum well heterostructure laser.

Reference is made to FIG. 1 wherein there is schematically illustrated wavelength selective feedback system 11 including a single quantum well heterostructure laser 10 having a p-n junction and optical cavity represented by the dotted line 10'. One facet of laser 10 is provided with an antireflection (AR) coating 15. The AR coating 15 reduces the reflectivity at the laser facet to about 5% or less. The output from the AR coated facet is collimated via objective lens 21 having, for example, a numerical aperture equal to 0.95 and a focal length of 25 mm to a diffraction grating plate 23. Plate 23 includes a grating pattern 25, e.g., 1200 lines/mm (6000 Å blaze).

The grating rulings of pattern 25 are perpendicular to the p-n junction 10' of laser 10 so that the grating is rotatable about an axis 27 perpendicular to the junction plane of the laser. As reported by Paoli et al., supra, this arrangement for the grating ruling relieves the necessity for critical alignment of the grating relative to the laser output encountered with parallel grating orientation.

A portion of the dispensed radiation from grating 25 is focused back from the grating through lens 21 and focused onto the plane of the laser facet to form an optical spectrum parallel to the deposited layers of laser 10. The relative position of the laser current confinement stripe and the dispersed spectrum focused to the facet plane determine the lasing wavelength. The path between the AR coated facet of laser 10 and grating pattern 25 becomes part of the Fabry-Perot cavity of the laser.

The output from the opposite facet of laser 10 is focused via objective lens 29 to a spectrometer 31 to determine the operating wavelength of laser 10 as well as observe changes made to the operating wavelength upon rotation of grating plate 23 about axis 27.

Figure 2:
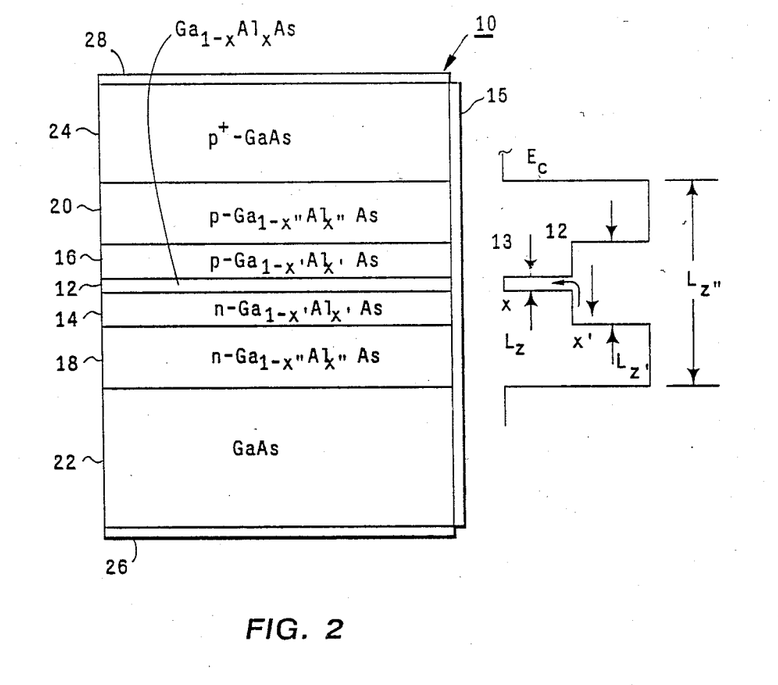
FIG. 2 is a cross-sectional view of a single quantum well heterostructure laser and accompanying energy band profile for the laser illustrated in FIG. 1.

FIG. 2 details the structure of the single quantum well heterostructure laser 10. Laser 10 comprises a substrate 22 of n-GaAs upon which are consecutively deposited, via MO-CVD, the following layers: an outer cladding layer 18 of n-Ga$_{1-x''}$Al$_{x''}$As, an inner cladding layer 14 of n-Ga$_{1-x'}$Al$_{x'}$As, a single quantum well active layer 12 of undoped Ga$_{1-x}$Al$_x$As, an inner cladding layer 16 of p-Ga$_{1-x'}$Al$_{x'}$As, an outer cladding layer 20 of p-Ga$_{1-x''}$Al$_{x''}$As and cap or contact layer 24 of p+GaAs. Laser 10 is provided with a bottom metal contact 26.

Proton bombardment through a photoresist mask on layer 24 is employed to provide current pumping stripes of 10 μm width over which is applied the metal contact 28. Current pumping of laser 10 is provided via contacts 26 and 28. As shown by the accompanying energy band profile, $E_c$, in FIG. 2, $L_z$ may be in the range of 60 Å to 80 Å, $L_{z'}$ may be about 0.13 μm and $L_{z''}$ may be about 1.83 μm. Relative to the molar factor for x, x is equal to zero, x' may be approximately 0.30 and x" may be approximately 0.85. It should be noted that the molar factor x' need not be identical for cladding layers 14 and 16. In fact, there may actually be a difference in their value due to differences in the impurity profiles.

Outer cladding n-type layer 18 may have a Se doping impurity concentration of approximately $5 \times 10^{17}/cm^3$ and may be approximately 0.90 μm thick. Outer cladding p-type layer 20 may have a Mg doping impurity concentration of approximately $5 \times 10^{17}/cm^3$ and may be approximately 0.80 μm thick.

The stair step structure of laser 10 comprising layers 12, 14 and 16 provide a "well within a well", forming a carrier reservoir for the well 13 and a waveguide region for propagating radiation within the confines of outer cladding layers 18 and 20.

The laser 10 may be 50 to 1000 μm long and 250 μm wide. The laser 10 may be mounted with indium solder onto a copper heat sink for support and CW operation, e.g., operated continuously at room temperature with a current, for example, of 88.5 mA (current density equal to 1.8 KA/cm$^2$).

Figure 3:
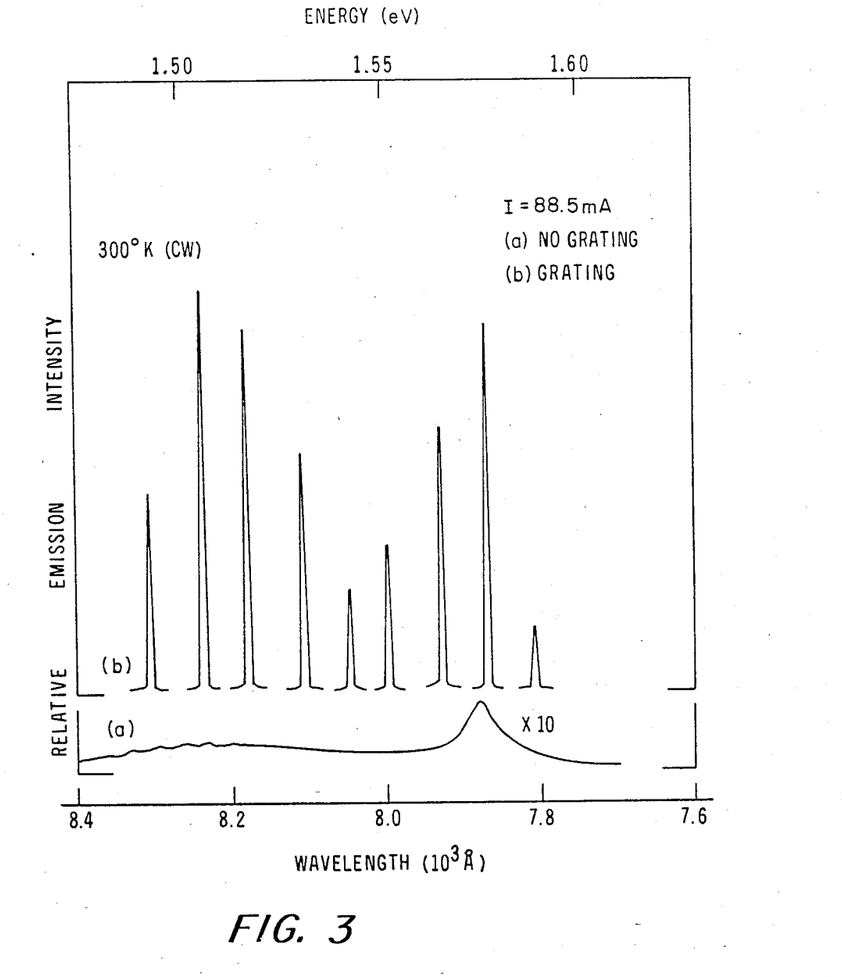
FIG. 3 illustrates the wavelength tuning range for the laser of FIG. 2.

FIG. 3 illustrates the typical wavelength tuning results for a laser 10 in the system of FIG. 1. Curve (a) of FIG. 3 illustrates the typical spontaneous emission spectrum for laser 10 at ten times magnification when the grating is blocked or covered. Curve (b) illustrates the gain profile of only but a few of the tunable wavelengths possible over the emission spectrum of the laser 10 by rotation of grating plate 23. However, with the grating plate 23 uncovered, numerous other linewidth operating wavelengths are obtainable throughout the wavelength range as indicated in the illustrated profile spectrum (b). Only a few of the tunable linewidth wavelengths are actually illustrated in FIG. 3 at (b). Other specifically selective linewidth operating wavelengths are obtainable between pairs of the nine linewidths illustrated at (b) by rotation of grating plate 23. The two high peaks in the gain profile at λ equals to 7875 Å and at λ equal to 8230 Å are in the region of the n=2 e→hh (electron-to-heavy-hole) and the n=1 e→hh (electron-to-heavy-hole) and n'=1' e→lh (electron-to-light-hole) transitions, which agrees with the quantum well size.

The current employed for the laser 10 of FIG. 3 was only 1.5 mA above laser threshold. Higher operating currents should yield greater operating bandwidths and corresponding broader tuning wavelength range.

The gain profile exhibits two distinct features: (1) a higher energy recombination radiation band centered at λ=7875 Å which corresponds to the n=2 e→hh transitions, and (2) a broader lower energy band with a maximum at λ=8230 Å which corresponds to the smeared n=1 e→hh and n'=1' e→lh transitions. The spontaneous emission curve (a) mimics the laser gain profile in its general features and indicates the dramatic effect of the grating feedback. The linewidth of the laser emission is 150 MHz (3 Å) at λ=7874 Å with 1 equal about 95 mA.

Figure 4:
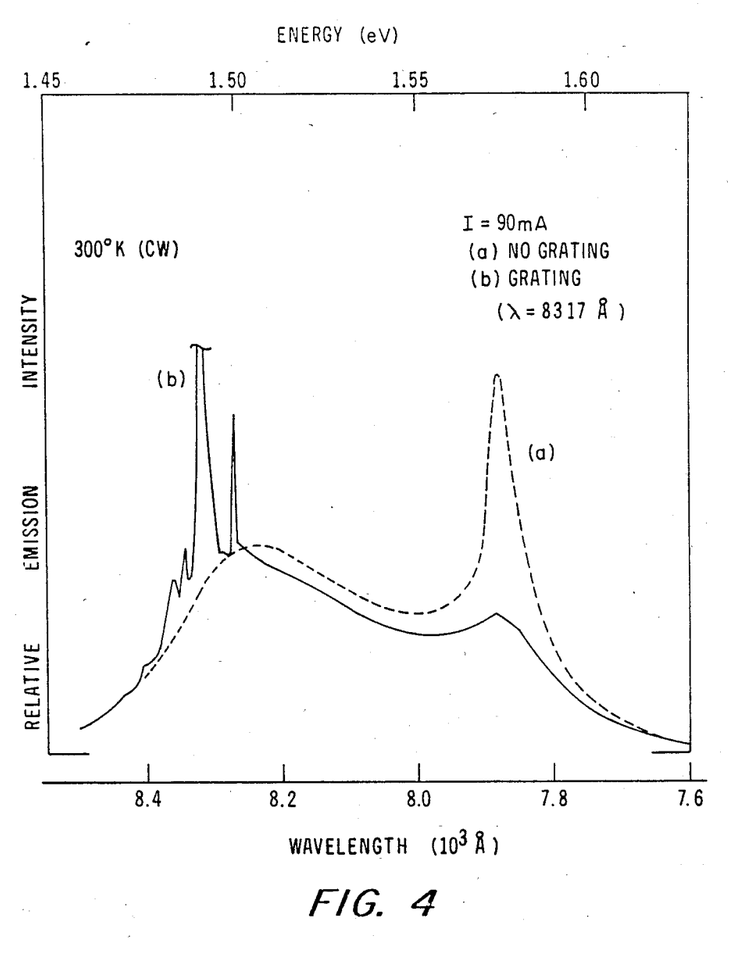
FIG. 4 illustrates the influence of the external grating cavity upon the recombination radiation spectrum of the laser of FIG. 2.

The influence of the grating upon the carrier recombination kinetics is illustrated in FIG. 4 for the same laser 10 of FIG. 3. Curve (a) is the case where no grating is involved, i.e., the grating is covered. Curve (b) is the case where the grating is present. When the grating is uncovered, the stimulated emission and carrier scattering draws the recombination into the narrow energy range in which the grating is tuned, i.e., $\lambda = 8317$ Å in FIG. 3. Simultaneously, as shown by comparing curve (a) with curve (b), the recombination radiation intensity in the region of the $n=2$ e→hh transition at $\lambda$ equal about 7875 Å diminishes. Thus, the higher energy emission near the $n=2$ e→hh transition, $\lambda$ equal approximately 7875 Å, curve (a), is sharply reduced as the grating is rotated to tune to a wavelength of $\lambda$ equal approximately 8317 Å or near $n=1$ e→hh and $n'=1'$ e→lh transitions, curve (b). The low intensity lines surrounding the main laser mode of curve (b) in FIG. 4 are due to imperfections in the grating 25 and lens 21 system and are observed only in the longer wavelength emission.

In summary, a 100 meV tuning range is obtainable with a single quantum well laser 10 operating cw at room temperature in an external grating cavity. The continuous range of grating tuning from 7800 Å to 8300 Å has been obtained at a moderate value of current, only 1.5 mA above threshold. The bandfilled quantum well provides an ideal active region to support stimulated emission over a wide energy range. The gain profile of the $n=1$ and $n'=1'$ (electron-to-heavy hole and electron-to-light hole, e→hh and e→lh) transitions and the $n=2$ electron-to-heavy hole transitions are clearly outlined by the intensity of the selected laser lines. The partial homogeneous broadening of the gain profile indicates that a substantial fraction of the carriers within the well 13 can be drawn into a selectively narrow energy range at a specific energy state as determined by the tuning of the external grating cavity via rotation of grating plate 23.

Further experiments with other single quantum well lasers having the structure shown in FIG. 2 have illustrated broader wavelength tuning ranges are achievable, e.g., from 7700 Å to 8400 Å or a wavelength tuning range in excess of 700 Å.

Figure 5:
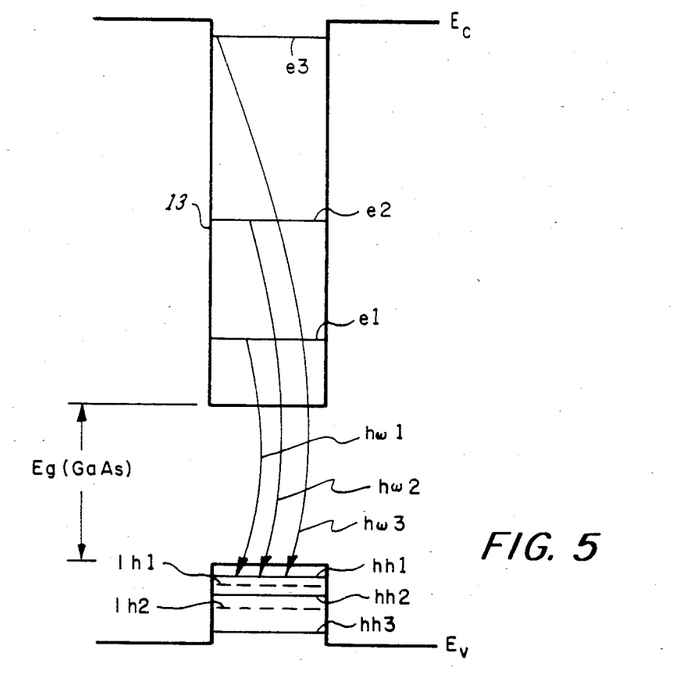
FIG. 5 is a graphic illustration of the quantum well energy band configuration for a laser of FIG. 2 and examples of the energy state boundaries of each subband existing in the quantum well structure.
Figure 6:
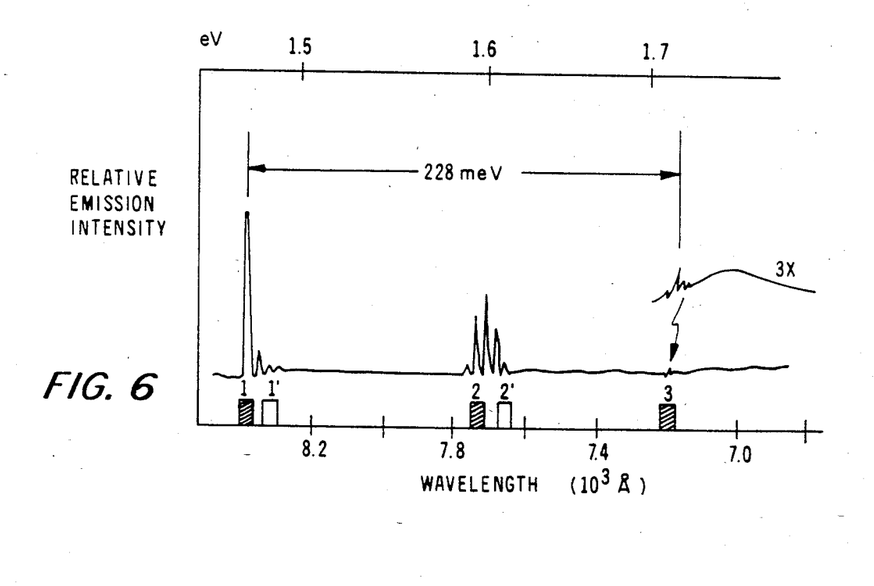
FIG. 6 is an illustration of the modal emission spectrum for the laser of FIG. 2 and indicative of the multiple energy states at the sub-band edges illustrated in FIG. 5.

FIGS. 5 and 6 respectively illustrate the energy band profile, and three energy states and emission spectrum for a typical laser 10. A purpose of this illustration is to emphasize the unexpectation in the selective tuning range continuously through one or more conduction and valance band sub-bands obtainable with quantum well injection lasers and not fully appreciated prior to this time. Between the selected linewidths of FIG. 4, there are found to be many other allowed wavelengths that can be selected with the external grating 25 because of the large bandfilling range of a quantum well heterostructure.

FIG. 5 illustrates energy band profile for quantum well 13. The bound states are labeled "e" for electron states, "hh" for heavy hole states and "lh" for light holes states. An $n=1$ electron-to-heavy hole recombination transition e→hh emitting a photon of energy is $h\omega = E_g(GaAs) + E_{e1} + E_{hh1}$. As exemplified in FIG. 5, energy levels e1, e2 and e3 are of increasing energy states at the sub-band edges so that the recombination transition for $n=1$, 2 and 3 are of increasing energy. This is illustrated by the emission spectrum in FIG. 6 wherein it can be seen that the laser 10 operates at the points of $n=1$, 2 and 3 transitions, which are representative of the definitive sub-band energy states e1, e2 and e3. By employing the external grating 25 as part of the optical cavity, a selected wavelength operating in single longitudinal mode of laser 10 may be chosen in the sub-band region starting with, for example, the $n=1$ transition. While we haven't, as of yet, demonstrated tuning capability much beyond the $n=2$ transition, it is submitted that with proper optimazation of one or more laser parameters, e.g., the employment of a broad band antireflection coating on one of the laser facets in lieu of coating 15, quantum well design considerations of increase quantum stair step thickness or increase Al concentration of the inner cladding layers, doping and doping levels of the quantum well or wells, and going to higher pumping currents, the range of selective wavelength tuning should be easily extendible between more than one n transition, e.g., from the $n=1$ transition (about 8400 Å in FIG. 6) to the $n=3$ transition (about 7200 Å in FIG. 6). On the other hand, the prior art work with conventional heterostructure lasers which do not operate without any appreciable band filling are tunable only with the emission spectrum of the lowest energy level of $h\omega = E_g(GaAs)$, e.g., 30 meV to 40 meV.

Although a wide range of tuning capability has been demonstrated in a single quantum well structure where the well thickness is about 60 Å to 80 Å, there is some evidence, based upon published literature, that the widths of spontaneous emission spectrum for a single quantum well with a thicker active layer, e.g. 200 Å, may also provide a wide range of tuning capability. In this regard, see the emission spectrum for $L_z$ equal to 200 Å in FIG. 2 of the article of R. D. Dupuis et al., "Quantum Well $Ga_{1-x}Al_xAs$-GaAs Heterostructure Lasers grown by Metalorganic Chemical Vapor Deposition", IEEE *Journal of Quantum Electronics,* Vol. QE-15(8), pp. 756–761, August, 1979.

Figure 8:
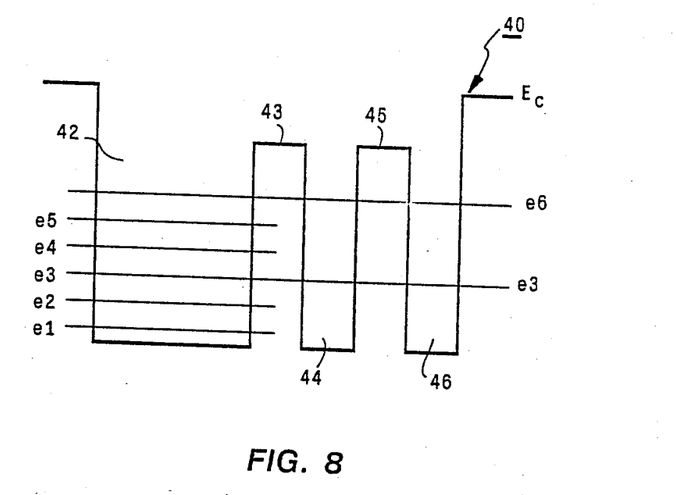
FIG. 8 is a further illustration of a multiple quantum well configuration capable of appreciable band filling range and, therefore, an appreciable tunable wavelength range.

The wavelength tuning herein disclosed is extendable to multiple quantum well lasers that are appreciably bandfilled, i.e., carriers are accepted at a rate that exceeds the rate of carrier mobility to lower energy levels. Proper design optimization may provide for a large bandfilling range. However, the thickness of the wells and barriers is more critical than for a single well structure because the carriers tend to thermalize to the lowest energy levels of the wells at increasingly faster rates as the number of wells of the structure is increased. This is specially true if the carrier tunneling between adjacent wells is fairly high. In this connection, see the spontaneous emission spectrum for the four well multiquantum well laser structure, where $L_z$ equals 90 Å, of FIG. 5 of the article of R. D. Dupuis et al., supra and the spontaneous emission spectrum for the combination four "thin" well/single "fat" well laser structure of FIG. 1 of the article of J. J. Coleman et al., "Induced Phonon-Sideband Laser operation of Large Quantum Well $Ga_{1-x}Al_xAs$-GaAs Heterostructures ($L_z \approx 200$–500 Å)", *Applied Physics Letters,* Vol. 37(1), pp. 15–17, July 1, 1980. A structure similar to that shown in FIG. 1 of Coleman et al. is illustrated in FIG. 8 herein.

The electron energy states for N coupled identical wells spreads out in band-like states within the wells of both the conduction and valence bands. Thus, the range of tunability with an external diffraction grating would depend on the band-like states that exist in the quantum wells. Examples of possible designs are disclosed in FIGS. 7 and 8 in the form of energy band profiles.

Figure 7:
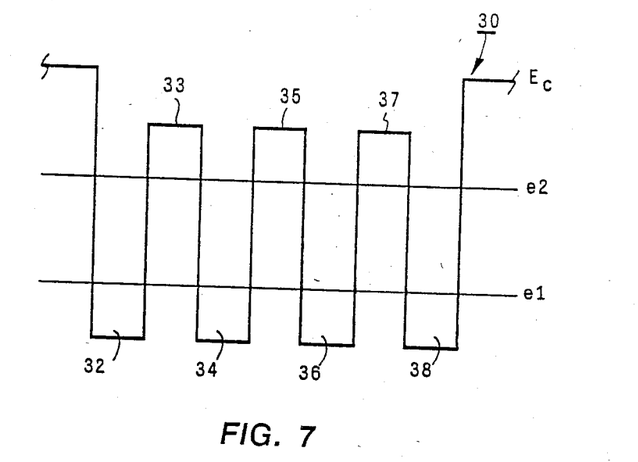
FIG. 7 is an illustration of a multiple quantum well configuration capable of an appreciable band filling range and, therefore, an appreciable tunable wavelength range.

In FIG. 7, the energy band profile 30 comprises four quantum wells consisting of layers 32, 34, 36 and 38 and may comprise $Ga_{1-x}Al_xAs$, where x is about 0.05. Each well may be each about 50 Å thick. Barrier layers 33, 35 and 37 may comprise $Ga_{1-x'}Al_{x'}As$, where x' is about 0.35. Each barrier may be about 50 Å thick. Also illustrated are energy levels e1 and e2 of increasing energy states at the sub-band edges.

The well widths and the barrier widths of the multiple quantum well structure can be different, i.e., they need not be equal to one another or the same width as an adjacent well or barrier. An example of different well widths is illustrated in FIG. 8.

FIG. 8, the energy band profile 40 comprises three quantum wells consisting of layers 42, 44 and 46 and may comprise $Ga_{1-x}Al_xAs$, where x is about 0.05. Well 42 may be about 200 Å thick. Wells 44 and 46 may be each about 50 Å thick. Barrier layers 43 and 45 may comprise $Ga_{1-x'}Al_{x'}As$, where x' is about 0.35. Each barrier may be about 50 Å thick. Also illustrated are energy levels e1–e7 of increasing energy states at the sub-band edges with energy levels e3 and e6 representative of fundamental sub-band edges for the total well structure while the other energy levels are representative of sub-band edges of the well 42.

Figure 9:
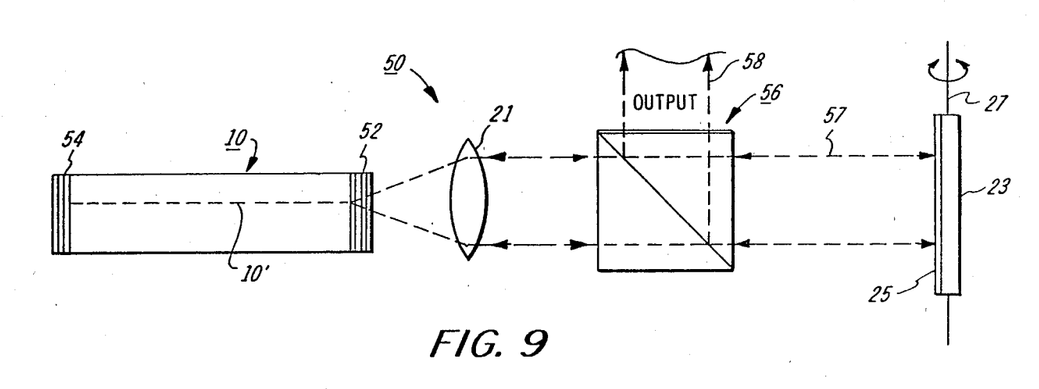
FIG. 9 is a schematic illustration of a modified system, vis a vis FIG. 1, to provide selective wavelength feedback via a quantum well heterostructure laser.
Figure 10:
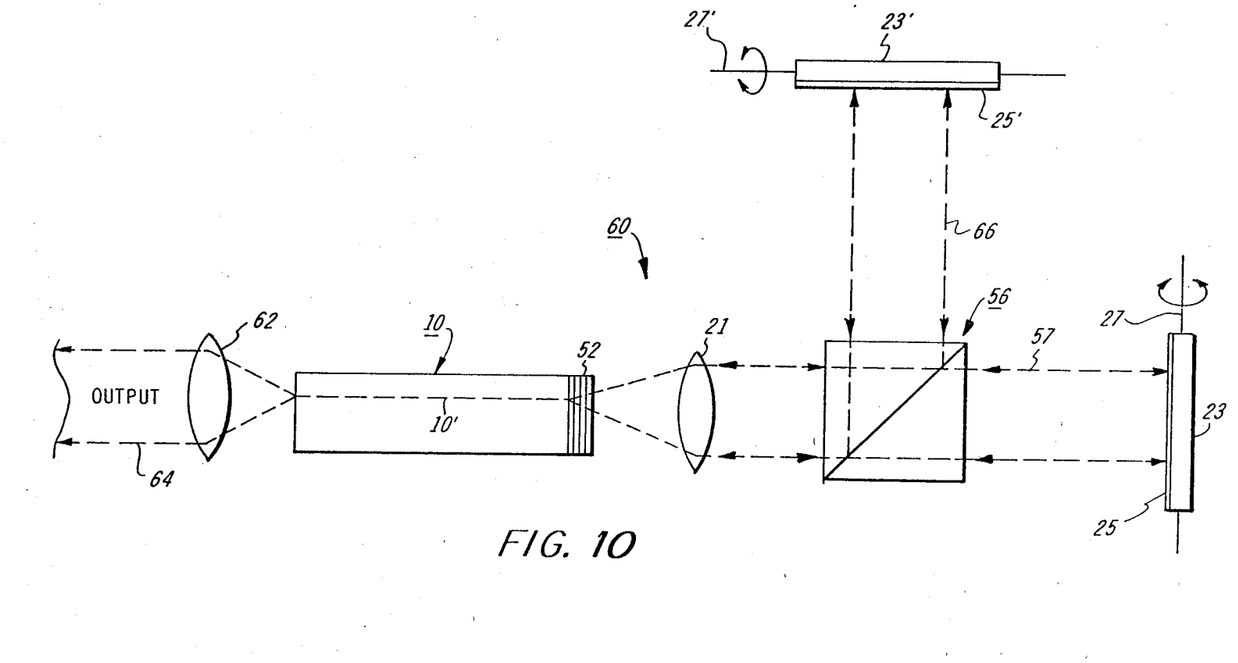
FIG. 10 is a further schematic illustration of a modified system vis a vis FIG. 1 to provide multiple, selective wavelength feedback via a quantum well heterostructure laser.

Reference is now made to FIGS. 9 and 10 wherein there is schematically illustrated wavelength selective feedback systems 50 and 60, respectively, which are modified relative to system 11 shown in FIG. 1.

In FIG. 9, system 50 includes laser 10 with a deposited broad band anti-reflective means 52 in lieu of anti-reflective coating 15 on one of the laser facets. Means 52 comprises a multilayer dielectric stack. Stack 52 is conventional in the art and comprises alternating layers of dielectric compounds of different refractive index, such as alternating layers of $Al_2O_3$ and $TiO_2$. Stack 52 permits the passage of a broad portion of the spontaneous emission spectrum from laser optical cavity 10'. The other facet of laser 10 includes a deposited reflective stack 54 for reflecting 100% of the radiation at this other laser facet.

The output from the stack 52 is collimated via objective lens 21 to a beam splitter 56 and, via beam path 57, is imaged onto grating 25 of diffraction grating plate 23. The selected tuned wavelength output for a contemplated application is provided via beam path 58 from beam splitter 56.

System 60 in FIG. 10 provides for selective tuning of two different wavelengths in the spontaneous emission spectrum of laser 10. Laser 10 includes a deposited broad band anti-reflective means 52, as in the case in FIG. 9.

The other facet of laser 10 is the output for a contemplated application for system 60. This output is collimated by objective lens 62 to provide an output beam via beam path 64.

The output from the stack 52 is collimated via objective lens 21 to beam splitter 56 and, via beam path 57, is imaged onto grating 25 of diffraction grating plate 23. A portion of this output is directed, via beam splitter 56, to beam path 66 and imaged onto grating 25' of diffraction grating plate 23'. Like plate 23, grating plate 23' is rotatable about an axis 27'. With this configuration, each grating 25 and 25' may be respectively adjusted to provide two different wavelengths selected from the emission spectrum of laser 10 to be provided as an output via beam path 64.

While the invention has been described in conjunction with specific embodiments, it is evident that many alternatives, modifications and variations will be apparent to those skilled in the art in light of the foregoing description. For example, the method of tuning may be extended to coupled multiple strip quantum well laser arrays. Also, the design of the quantum well configuration could be changed to have a funnel shape or stair step profile. Accordingly, it is intended to embrace all such alternatives, modifications, and variations as fall within the spirit and scope of the appended claims.

What is claimed is:

1. Apparatus for selective tuning the emission wavelength of a semiconductor laser comprising a semiconductor injection laser having an optical cavity for radiation generation and propagation under lasing conditions, an anti-reflection means on one facet of said laser, a rotatable diffraction grating positioned to be in alignment with the output emission spectra from said one facet, means to image the output emission spectra from said one facet onto said grating, said grating rotated to select the desired operating wavelength within the emission spectra of said laser, said apparatus characterized in that said laser contains a quantum well structure capable of exhibiting quantum size effects comprising more than one energy band state, the rotation of said grating effective to select one of a possible number of wavelengths represented by the spectra emission between said bands as well as through each of said bands.

2. The apparatus of claim 1 wherein said laser is a single quantum well heterostructure laser.

3. The apparatus of claim 1 wherein said laser is a multiple quantum well heterostructure laser having a plurality of wells and barriers.

4. The apparatus of claim 3 wherein at least some of said wells or barriers are of different dimensional width.

5. The apparatus of claim 1 which includes reflector means deposited on the other of said laser facets to reflect the output emission spectra therefrom back into said optical cavity, a beam splitter interposed between said focus means and said grating to direct a portion of said output emission spectra transversely therefrom as the selected operating wavelength output within the emission spectra of said laser.

6. The apparatus of claim 5 wherein said anti-reflection means comprises a braod band anti-reflecting means.

7. The apparatus of claim 6 wherein said broad band anti-reflecting means comprises a multilayer dielectric stack.

8. The apparatus of claim 1 wherein the other of said laser facets constitutes the operating output for said laser, a beam splitter interposed between said focus means and said grating to direct a portion of said output emission spectra transversely therefrom, a second rotatable diffraction grating positioned in alignment with said transverse output emission spectra portion whereby both of said gratings are rotated to select a pair of operating wavelengths within the emission spectra of said laser for output at said other facet.

9. The apparatus of claim 8 wherein said anti-reflection means comprises a broad band anti-reflecting means.

10. The apparatus of claim 9 wherein said broad band anti-reflecting means comprises a multilayer dielectric stack.

11. A wavelength tunable semiconductor laser comprising a plurality of contiguous semiconductor layers deposited on a substrate, one of said layers being an active region and having a lower bandgap and higher index of refraction relative to at least cladding layers immediately adjacent to said active region, said active region permitting carrier recombination and supporting radiation propagation under lasing conditions in an optical cavity established between transverse end facets of said laser, an antireflection coating on at least one facet of said laser, a diffraction grating in the path of radiation emission from said one facet of said laser, means to image said emission onto said grating, said grating rotatable to change the emission dispersion reflected from said grating and focused back to said one facet via said imaging means, said laser comprising a quantum well heterostructure laser with a multiple quantum well configuration capable of quantization of electron states and having more than one energy band, the rotation of said grating effective to tune said quantum well laser to any wavelength represented by a plurality of subband electron/hole states established within said quantum well energy bands.

12. The wavelength tunable semiconductor laser of claim 11 wherein said quantum well heterostructure laser comprises a multiple quantum well heterostructure having a plurality of wells and barriers.

13. The wavelength tunable semiconductor laser of claim 12 wherein at least some of said wells or barriers are of different in dimensional width.

14. The method of selective tuning the emission wavelength of a semiconductor laser to provide a broad tuning range comprising the steps of selecting a semiconductor laser that exhibits quantum size effects and provides more that one energy band, providing an anitreflecting coating on one facet of the laser, imaging the emission spectra from said one facet onto a diffraction grating and rotating the grating to selectively tune the output wavelength of the laser to any one of a possible number of wavelengths available between energy bands as well as through each energy band.

15. The method of claim 14 wherein said laser is a single quantum well heterostructure laser.

16. The method of claim 14 wherein said laser is a multiple quantum well heterostructure laser having a plurality of wells and barriers.

17. The method of claim 11 which includes the step of varying the well and/or barrier widths of said wells and barriers to increase the number of band-like states and, consequentially, the wavelength selection range of the laser.

* * * * *